(12) United States Patent
Kwak et al.

(10) Patent No.: US 6,876,428 B2
(45) Date of Patent: Apr. 5, 2005

(54) METHOD OF MANUFACTURING A LIQUID CRYSTAL DISPLAY PANEL USING A GRAY TONE MASK

(75) Inventors: Dong-Yeung Kwak, Daegu (KR); Sang-Moo Song, Daegu (KR)

(73) Assignee: LG Philips LCD Co., Ltd., Seoul (KR)

( * ) Notice: Subject to any disclaimer, the term of this patent is extended or adjusted under 35 U.S.C. 154(b) by 383 days.

(21) Appl. No.: 10/163,431

(22) Filed: Jun. 7, 2002

(65) Prior Publication Data
US 2002/0186332 A1 Dec. 12, 2002

(30) Foreign Application Priority Data
Jun. 8, 2001 (KR) ........................................ 2001-32067

(51) Int. Cl.$^7$ ................................................. G02F 1/13
(52) U.S. Cl. ............................ 349/187; 430/5; 438/30
(58) Field of Search ..................... 349/187, 43; 438/30; 430/5

(56) References Cited

U.S. PATENT DOCUMENTS 5,725,975 A * 3/1998 Nakamura et al. ............. 430/5
5,906,910 A * 5/1999 Nguyen et al. ............. 430/311
6,816,233 B2 * 11/2004 Sugita ........................ 355/53

FOREIGN PATENT DOCUMENTS

JP 8-250446 A 9/1996
JP 8-306615 A 11/1996

* cited by examiner

Primary Examiner—Kenneth Parker
Assistant Examiner—David Chung
(74) Attorney, Agent, or Firm—Birch, Stewart, Kolasch & Birch, LLP

(57) ABSTRACT

A gray tone mask, which is patterned and used in a photo-lithographic manufacturing process wherein a plurality of thin films are deposited and patterned on a substrate, said mask having different gaps in the vertical and horizontal directions so that the quantity of light which passes the patterned mask and irradiated on the photosensitive material is controlled depending on the direction of light irradiated from an exposing apparatus; and a method of manufacturing a TFT of a LCD using just four masks.

33 Claims, 11 Drawing Sheets

METHOD OF MANUFACTURING A LIQUID CRYSTAL DISPLAY PANEL USING A GRAY TONE MASK

BACKGROUND OF THE INVENTION

1. Field of the Invention

The present invention relates to a method of manufacturing a liquid crystal display panel using a gray tone mask.

2. Description of the Background Art

Liquid crystal display (LCD) technology has been developing rapidly. It is used for most portable electronic devices due to its light weight. As its application range is enlarged, manufacturing technology with reduced cost and excellent productivity is required.

An LCD is made by depositing or coating a plurality of thin films and patterning by a photolithography process. The number of photo-masks used for manufacturing an LCD is a measure of process simplification. One cycle of photolithography is processed with one mask. Many researchers have studied the possible reduction of masks utilized, since to reduce only one photo-mask step could considerably reduce the manufacturing cost.

Generally, as shown in FIG. 2, an LCD comprises a color filter panel 30, an active panel 10 and liquid crystal 22 disposed between the two panels 10 and 30. Polarizing film 11 and 31 for the linear-polarizing of visible rays are mounted on the respective outer surfaces of the two panels 10 and 30. On one surface of the color filter panel 30 the polarizing film 31 is mounted and on the other surface a color filter 32 and common electrode 33 are formed. The polarizing film 11 is mounted on one surface of the active panel 10 and on the other surface a plurality of bus lines 12, a plurality of data bus line 13, a switching device A and a pixel electrode 16 are formed.

The structure of the active panel 10 will be described with reference to the schematic value shown in FIG. 2. The active panel 10 comprises a plurality of gate bus lines 12, gate bus line pad 12b, a plurality of data bus lines 13, data bus line pad 13b, switching device A and a pixel electrode. The plurality of gate bus lines 12 are parallel to each other and the plurality of data bus lines 13 cross the plurality of gate bus line 12 thus forming a matrix structure. In the area formed by the gate bus line 12 and data bus line 13, which cross each other, a TFT switching device which comprises a gate electrode 12a branched from the gate bus line 12, a source electrode 13a branched from the data bus line 13, and a drain electrode 13c opposed to the source electrode 13a, is positioned. The pixel electrode 16 is connected, through electrical contact with a hole 15, to the drain electrode 13c which is an output terminal of the switching device A.

The manufacturing process of the active panel of the above LCD apparatus will be described with reference to FIGS. 3A to 3G showing the manufacturing process of the section line a—a of FIG. 2 and FIGS. 4A to 4F showing the manufacturing process of the section line b—b of FIG. 2.

A first metal layer is formed on a transparent substrate such as a glass by depositing thereon one of aluminum and aluminum-based alloys (Al—Pd, Al—Si, Al—Si—Ti, Al—Si—Cu and the like). The plurality of gate bus lines 12, gate electrode 12a and the like are formed on the transparent substrate 11 by patterning the first metal layer using a first mask (FIGS. 3A and 4A).

An insulating layer 17' is formed using $SiN_x$ or $SiO_x$ which have an excellent interfacial characteristic and a high endurance voltage on the substrate including the plurality of gate bus lines 12 and gate electrode 12a thereon. On the insulating layer 17', intrinsic semiconductor material 18' such as amorphous silicon (a-Si) and extrinsic semiconductor substance 19' are deposited sequentially (FIGS. 3B and 4B).

A gate insulator 17, intrinsic semiconductor layer 18 and an extrinsic semiconductor layer (19) (ohmic contact layer) are formed by patterning the insulating layer 17', the intrinsic semiconductor material 18' and the extrinsic semiconductor 19' using a second mask (FIGS. 3C and 4C).

A second metal layer is formed on the substrate including the gate insulator 17, the intrinsic semiconductor layer 18 and the extrinsic semiconductor layer 19 by depositing thereon one of aluminum and aluminum-based alloys (Al—Pd, Al—Si, Al—Si—Ti, Al—Si—Cu and the like). Next, the plurality of data bus lines vertical to the above gate bus line 12 and the source electrode 13a branched from the data bus line 13 are formed by patterning the second metal layer using a third mask. Then, a drain electrode 13c for functioning as an output terminal in the position opposed to the source electrode 13A are formed (FIGS. 3D and 4D). The gate insulator 17, intrinsic semiconductor layer 18 and extrinsic semiconductor layer 19 are formed with the same width as that of the data bus line 13 and act as a buffer layer.

Next, a protecting film 20 is formed on the substrate including the gate bus line 12, data bus line 13, gate electrode 12a, semiconductor layers 18 and 19, source electrode 13a and the drain electrode 13c by coating with an insulating material such as $SiN_x$ or $SiO_x$ and the like (FIGS. 3E and 4E).

A contact hole 15 is formed by removing part of the protecting film 20 using a fourth mask (FIG. 3F) so that a part of the drain electrode 13c which is the output terminal of the switching device and positioned below the protecting film 20 can be exposed.

An Indium Tin Oxide (ITO) film is deposited on the entire surface of the substrate by sputtering. Then the ITO film is etched in a certain pattern using a fifth mask. Due to the formation of the ITO film pattern, a pixel electrode 16 is contacted with the drain electrode 13c which is the output terminal of the switching device through the contact hole 15 (FIGS. 3G and 4F). By the above respective processes, an active panel portion of a LCD are manufactured.

In the above manufacturing method, a TFT of an active panel is manufactured using 5 masks. Recently, efforts have been made to simplify the manufacturing process and the necessity for core technology capable of manufacturing a TFT using just 4 masks has been discussed.

SUMMARY OF THE INVENTION

The present method provides a method of manufacturing a TFT using just four masks, rather than the conventional five masks known in the art.

Accordingly, an object of the present invention is to provide a method of patterning a thin film of a display device such as the liquid crystal display device using a gray tone mask.

Another object of the present invention is to provide a method of finely patterning a very small size line in forming a photoresist with a gray tone.

Another object of the present invention is to provide a method of manufacturing a liquid crystal display panel using a gray tone mask.

In order to comply with the object of the present invention, a method of forming a pattern in a display device comprises the steps of providing a thin film; depositing a photo-sensitive layer on the thin film; exposing the photo-sensitive layer with light using a mask having a transparent portion and a partial transparent portion to pattern the photo-sensitive layer, the partial transparent portion including at least two portions having different transparent ratios to introduce light in different quantities to the photo-sensitive layer in accordance with the irradiating direction of the light; and etching the thin film using the patterned photo-sensitive layer.

Further, the method of manufacturing the liquid crystal display panel comprises the steps of forming a gate electrode on a substrate using a first mask; forming an insulating layer, at least one semiconductor layer, and a metal layer over the substrate; depositing the photosensitive layer on the metal layer; exposing the photosensitive layer the light using a second mask including a partial transparent portion and a transparent portion to form a gray toned exposed area at a channel region and etch shielding areas over a source/drain electrode forming region and a data line forming region of the metal layer, the partial transparent portion for diffracted-exposure including a plurality of slits having the different gaps in the vertical and horizontal exposing direction; removing the metal layer and the semiconductor layer at the portion except the gray toned exposed area and the etch shielding area; removing the photosensitive layer in the gray toned exposed area; forming source/drain electrodes by etching the semiconductor layer and the metal layer at the channel region; depositing a protecting layer over the surface of the substrate, the protecting layer having a contacting hole on the drain electrode by patterning the protecting layer using a third mask; forming a conductive layer over the surface of the substrate, the conductive layer being connected to the drain electrode through the contacting hole; and patterning the conductive layer using a fourth mask to form a pixel electrode.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings are included to provide a further understanding of the present invention and are incorporated in and constitute a part of this specification for illustrating the embodiments of the present invention and for serving to explain the principles of the present invention.

DETAILED DESCRIPTION OF THE PREFERRED EMBODIMENTS

Reference will now be made in detail to the preferred embodiments of the present invention, examples of which are illustrated in the accompanying drawings.

There are several methods for manufacturing a TFT array on an active panel of an LCD utilizing just four masks. One of the methods involves forming the active area and source/drain with one mask after forming a gate.

To form the active area and source/drain with one mask, a fine patterning technology is required. In the field of LCDs and semiconductors, a method for patterning each film on a device using a gray tone mask is suggested, which comprises forming stepped areas on a photoresist and sequentially etching the photoresist.

As the integration of electronic devices increases and the type of TFT is varied, fine patterning technology is demanded, particularly as an essential technique to simplify the process by reducing the number of masks.

Generally, patterns are formed through a photolithography process. In the process, the exposing apparatus, patterned mask, photosensitive material and the like are important process parameters. Among photolithography techniques, the resist process depends on the photo-mask or photoresist as a material, on a coating-developing machine as an apparatus, and on a mask aligner as a precision instrument, including an optical system.

Recently, the integration degree of electronic devices is increasing. This means that the integration degree of the pattern formed on the substrate of the semiconductor wafer is increasing. If the integration degree of the pattern increases, it is natural that the portion among patterns becomes fine. Therefore, the aligner used in the resist process should fulfill desired conditions.

As an exposing apparatus for the mass production of the LCD, an aligner using a scanning method is commonly used. The apparatus has the advantages that the exposing time can be reduced and a high resolution can be achieved by irradiating light on a patterned mask. However, for fine widths of lines, a more accurate patterning is required so as to reduce the number of masks in the manufacture of a TFT. Therefore, the present invention provides a mask pattern capable of forming a fine pattern in the case of patterning with exposing apparatus by a scanning method. The mask pattern is particularly applicable to exposing apparatus using the scanning method and thus the present invention is considered core technology for manufacturing a TFT with four masks.

Figure 1:
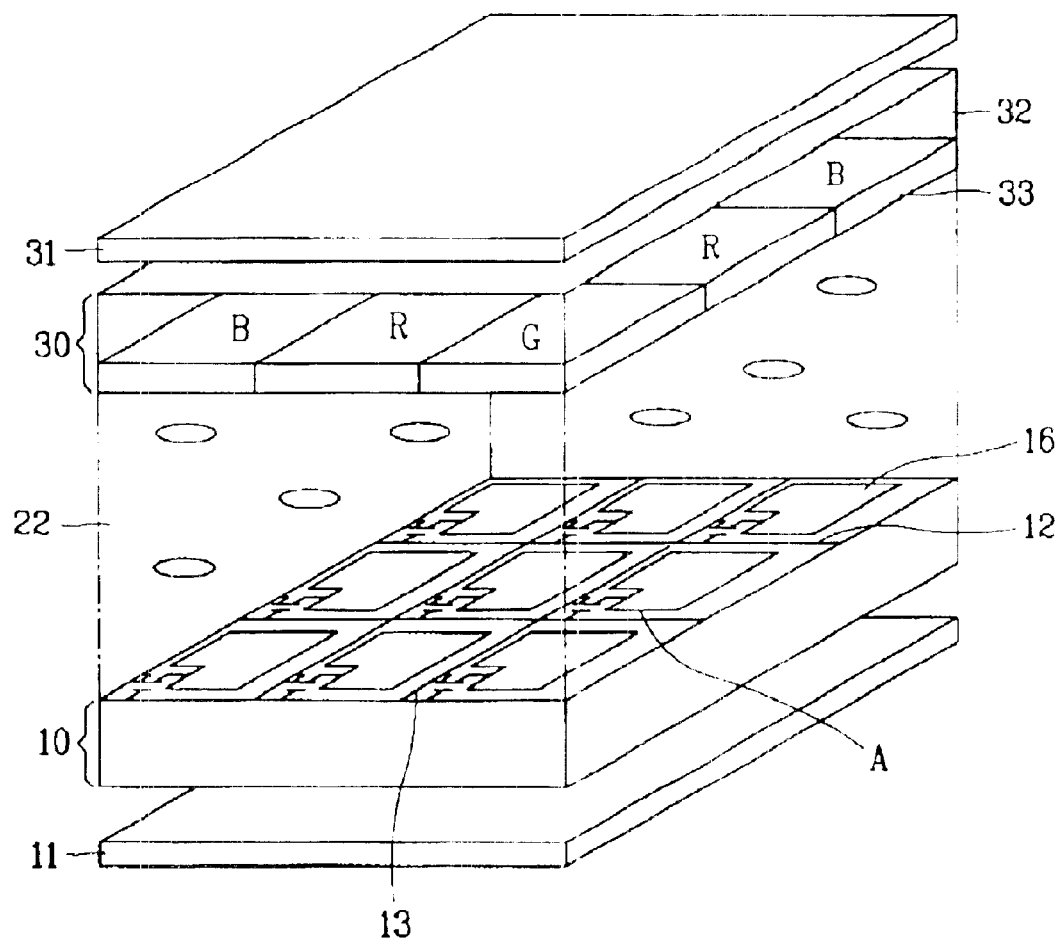
FIG. 1 is a schematic view showing the structure of a conventional LCD.
Figure 2:
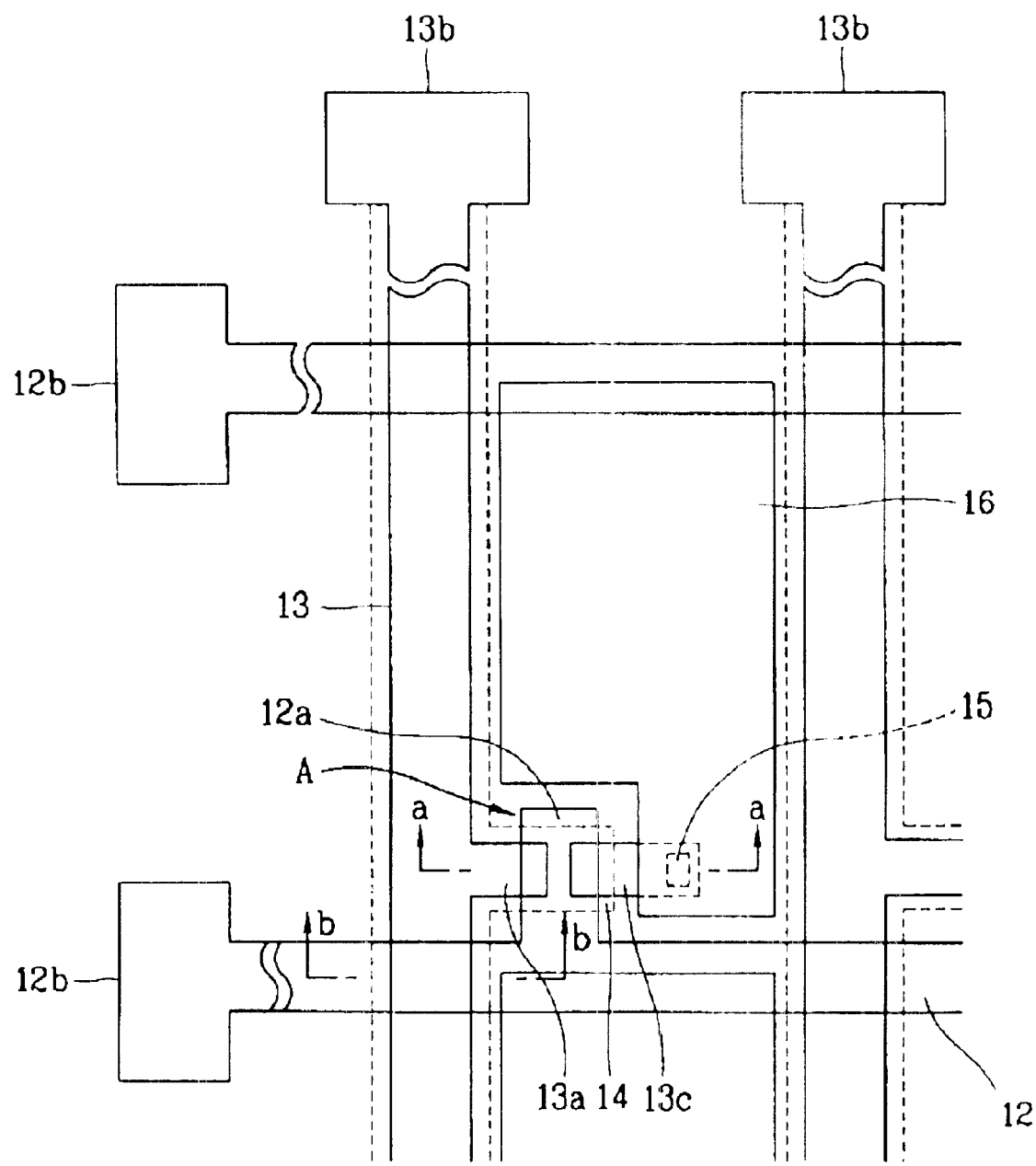
FIG. 2 is a schematic view showing the structure of an active panel in the conventional LCD.
Figure 3A:
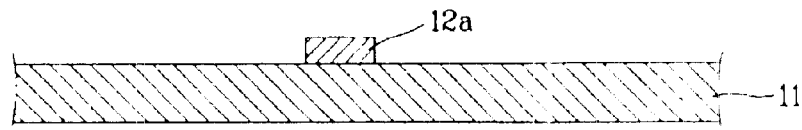
FIGS. 3A to 3G are cross-sectional views showing the manufacturing process of the section line a—a of FIG. 2.
Figure 3B:
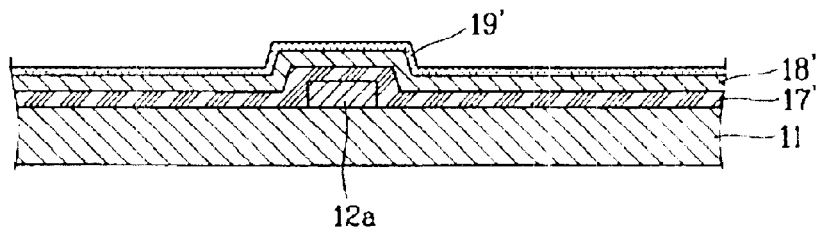
Figure 3C:
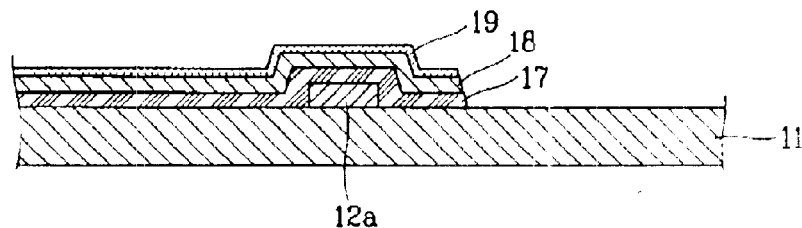
Figure 3D:
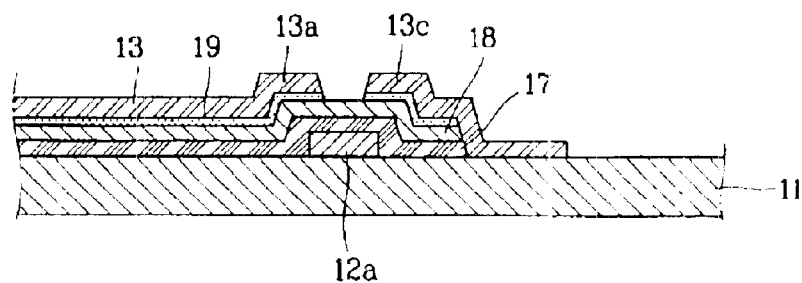
Figure 3E:
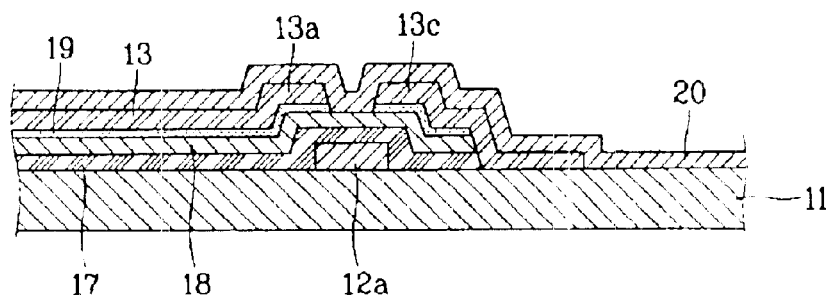
Figure 3F:
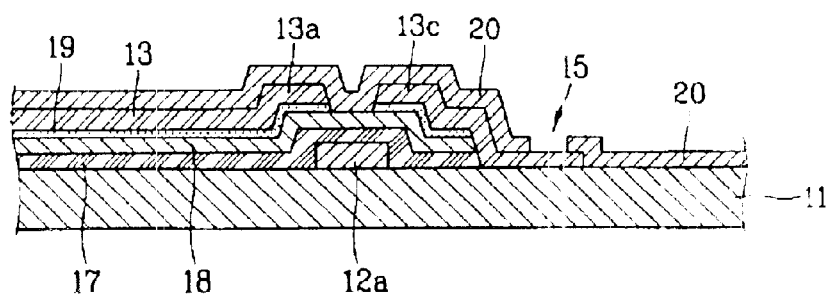
Figure 3G:
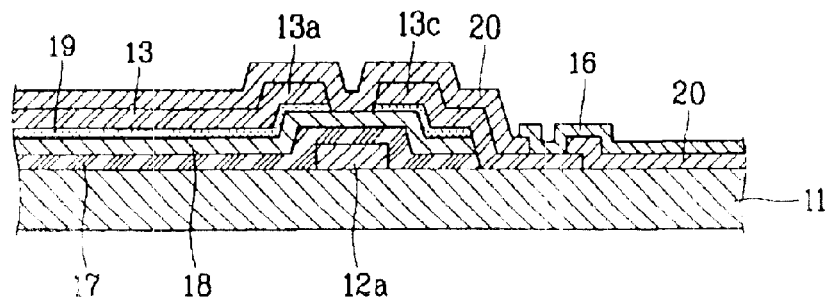
Figure 4A:
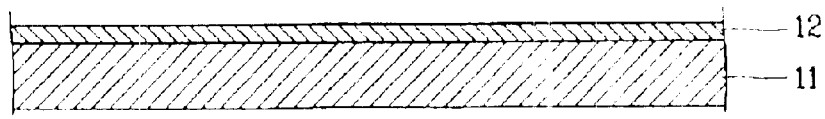
FIGS. 4A to 4F are cross-sectional views showing the manufacturing process of the section line b—b of FIG. 2.
Figure 4B:
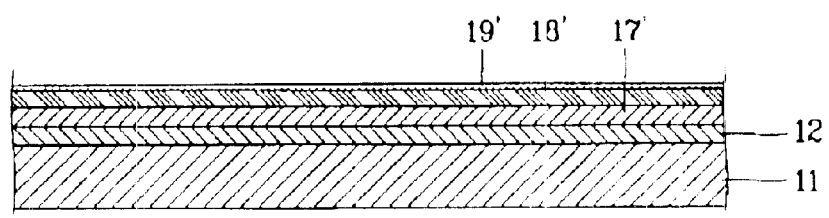
Figure 4C:
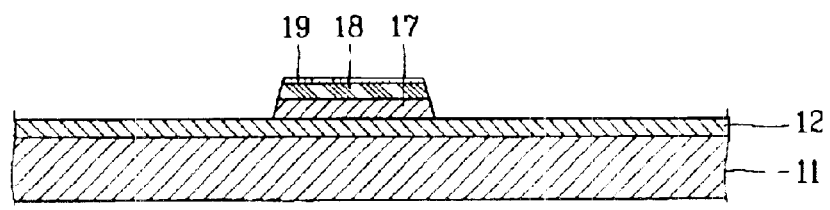
Figure 4D:
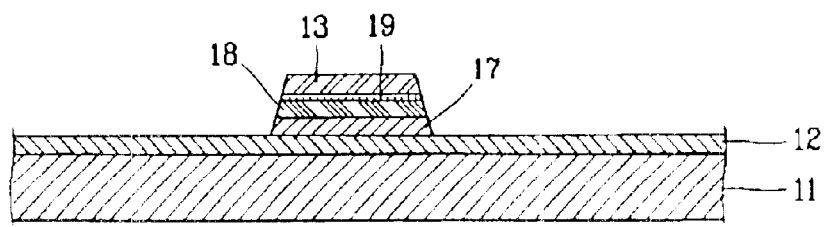
Figure 4E:
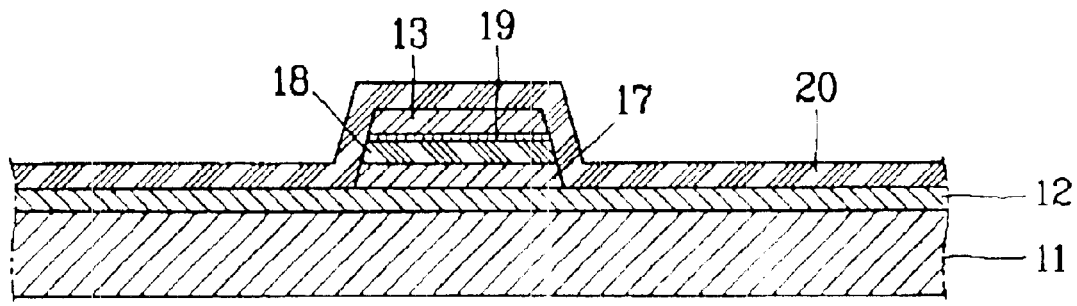
Figure 4F:
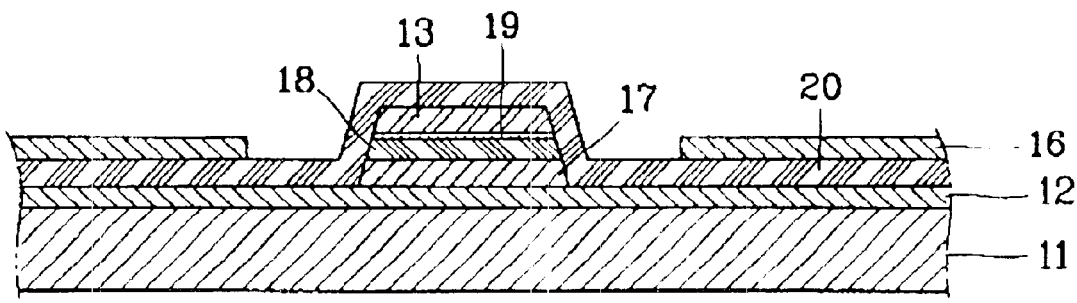
Figure 5:
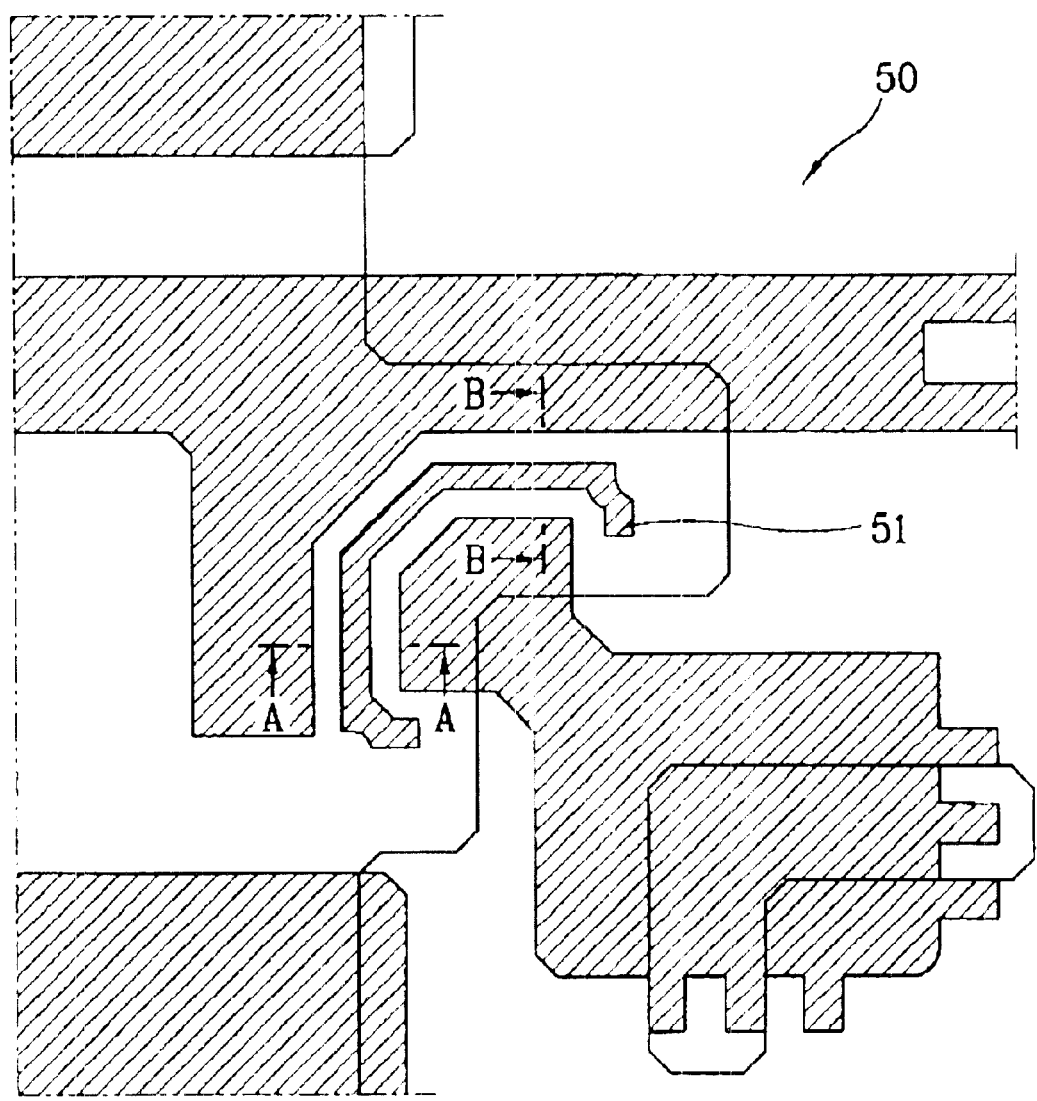
FIG. 5 is a plan view showing an example of a mask pattern.

FIG. 5 is a plan view showing an embodiment of a mask (50: portion of the oblique lines) used in the formation process of a TFT of an LCD panel. As shown in the figure, in the mask, a small slit 51 is formed in a channel area refracted from the vertical area (A–A' adjacent) to the horizontal area (B–B' portion) at the center portion. Light generated from an exposing apparatus has a different transmittance from that of another area by being refracted at the slit portion formed at the mask. Namely, since the area where the slit of the mask is formed and other areas have different transmittance respectively, though the patterned area is completely transmitted by light, the slit formation area has the characteristic of a half tone. Since the transmittance of light from the exposing apparatus is controlled by the mask of gray tone, a half tone layer exists in the developed photosensitive material after exposing, and multi-step etching is possible.

In a photo process by refracted exposure, the gray tone pattern is formed also in the photosensitive material on the substrate of an active panel and accordingly, there can be the case where a vertical and horizontal area are difficult to pattern in accordance with the scanning direction of the exposing apparatus.

For example, when light from an exposing apparatus scans the center area upwardly, where the slit 51 is formed, as shown in FIG. 5, the exposing degree of the areas (A–A' and B–B') which are horizontal (A–A') and vertical (B–B') to the scanning direction, may be different. This is because the exposing times of light in the horizontal and vertical directions, respectively, can be changed and the quantity of light irradiated to the photosensitive material due to refraction and interference of light can be changed.

Figure 6A:
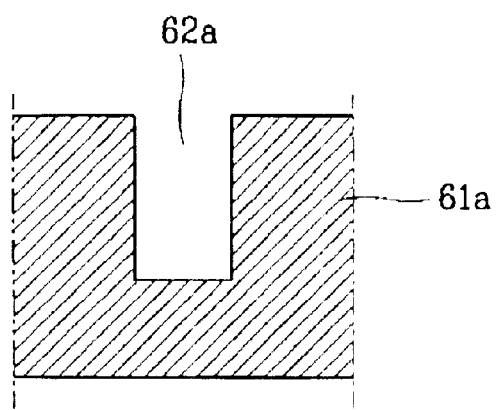
FIGS. 6A and 6B are cross-sectional views showing the developed photosensitive material of the section lines A—A and B—B of FIG. 5.
Figure 6B:
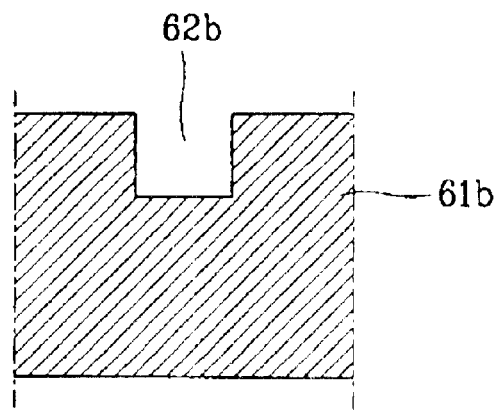

In this case, after exposing and developing, the degree of exposure of the photosensitive material is different, depending on the scanning direction. For example, FIGS. 6A and 6B shows that the height of the gray tone of the developed photosensitive material is different. FIG. 6A is a cross-sectional view showing the A–A' portion of FIG. 5 after exposure and development. It corresponds to an area parallel to the scanning direction of the light, where a certain quantity of light is irradiated to the photosensitive material 61a and an etched portion 62a is formed therein. On the other hand, FIG. 6b is a cross-sectional view showing the B–B' portion of FIG. 5 after exposure and development. It corresponds to an area vertical to the scanning direction of the light, where the etched portion 62b of the gray tone mask formed in the photosensitive material 61b is higher than that in FIG. 6A, since the quantity of irradiated light is relatively small.

If the results of exposing are different at the vertical and horizontal areas depending on the scanning direction of the exposing apparatus, accurate patterning is not possible and the process of forming the active area and source/drain area with one mask in a four-mask process becomes complicated.

Therefore, it is necessary to change the gray tone mask pattern so that a certain thickness of gray tone can be formed regardless of the scanning direction of the exposing apparatus. In the present invention, the slit 51 formed in the gray tone mask pattern 50 has a different shape at the vertical area to the scanning direction from that at the horizontal area.

Specifically, in case of using a positive photosensitive material, the quantity of exposed light is increased by reducing the width of the slit of the mask pattern in the area vertical to the scanning direction of light irradiated from the exposing apparatus or by increasing the gap between the slits.

To the contrary, in case of using a negative photosensitive material, the quantity of the exposed light is decreased by increasing the width of the slit of the mask pattern in the area vertical to the scanning direction of light irradiated from the exposing apparatus or decreasing the gap between the slits.

The size of the gap between the slits of the mask pattern in the horizontal and vertical areas to the scanning direction is changed according to the characteristic of the exposing apparatus such as, for example, the scanning speed and resolution of exposed light and also the photosensitive material utilized. Accordingly, the size of the gap or the slit can be determined differently according to respective cases.

Figure 7A:
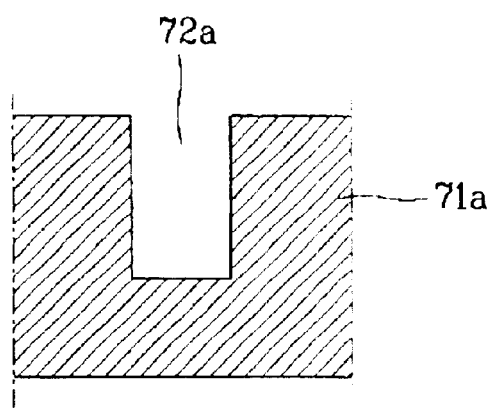
FIGS. 7A and 7B are cross-sectional views showing the developed photosensitive material using a mask in accordance with the present invention.
Figure 7B:
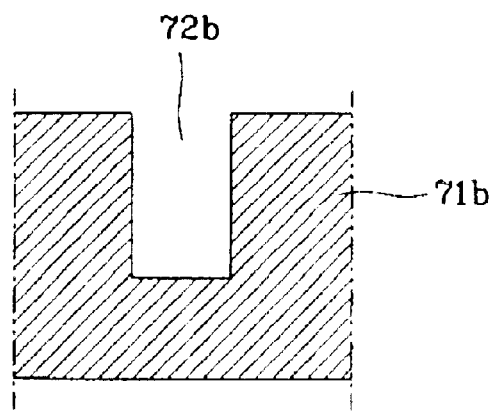

FIGS. 7A and 7B show photosensitive material patterned using the gray tone mask in accordance with the present invention. FIG. 7A shows the A–A' cross-section of FIG. 5 and FIG. 7B shows the B–B' cross-section of FIG. 5. In the both cases, the etched portions 72a and 72b of the gray tone formed in the photosensitive materials 71a and 71b, respectively, are of same. When the resolution of the exposing apparatus is 3 $\mu$m, for example, the gap between the slits can be 1.5 $\mu$m, the width of the slit in the A–A' area can be 1.5 $\mu$m, and the width of the slit in the B–B' area can be 1.4 $\mu$m.

By forming a gray tone with a certain thickness on the photosensitive material, the next etching step can be conducted naturally and the manufacturing of a TFT using four masks is possible.

Hereinafter, an embodiment of a TFT manufacturing method using the gray tone mask will be described. The method for manufacturing a TFT using four masks can be different from the following embodiment, but the gray tone mask of the present invention is applicable to the various four-mask processes.

Figure 8A:
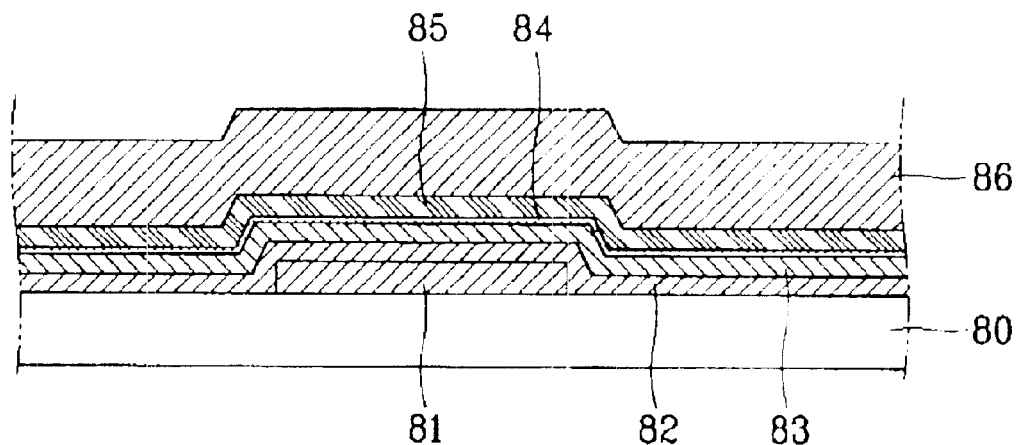
FIGS. 8A to 8E are cross-sectional views showing the manufacturing process of a TFT using the mask in accordance with the present invention.

FIG. 8A shows a cross-sectional view of a TFT array. A gate electrode 81 is patterned on a substrate 80 using first mask. Next, a gate insulator 82, a semiconductor layer 83 corresponding to an active area, an extrinsic semiconductor layer 84 and source/drain metal layer 85 are formed in order on the patterned gate electrode. A photosensitive material 86 is coated on the top of the resultant material.

Figure 8B:
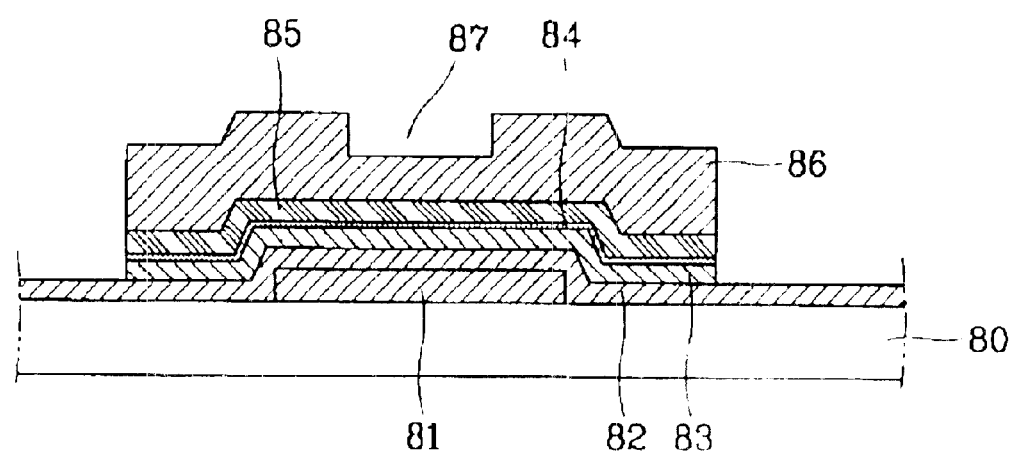

Next, the photosensitive material 86 is patterned using the gray tone mask in accordance with the present invention as the second mask in order to define the active area and the source/drain area with only one mask. And then, on the photosensitive material an exposed area with gray tone is formed in a certain thickness regardless of the vertical or horizontal direction to the scanning direction of the exposing apparatus. FIG. 8B shows a cross-sectional view of a TFT array after developing the exposed area.

The portion of gate electrode area of the photosensitive material 86, namely, the channel 87 is formed as a half tone and the other area of the active panel, for example, the gate line and pixel area, except the data line and thin film transistor, is completely exposed and etched. Accordingly, different thicknesses of exposure can be formed with just one mask. Therefore, the number of mask used in TFT manufacture can be reduced by etching the respective areas of the active panel in multi-steps.

Figure 8C:
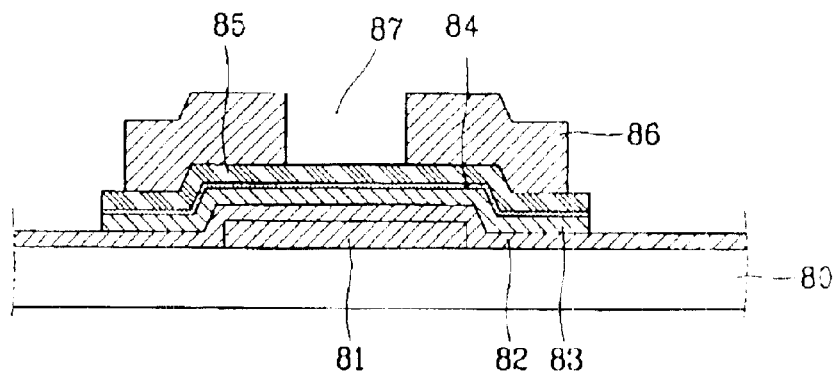

FIG. 8C is a cross-sectional view showing the step of removing completely the half tone area at the upper portion of the photosensitive material, namely, the channel area 87. The exposing area corresponding to the upper portion of the gate electrode is exposed so as to form the active area and the source/drain area.

Figure 8D:
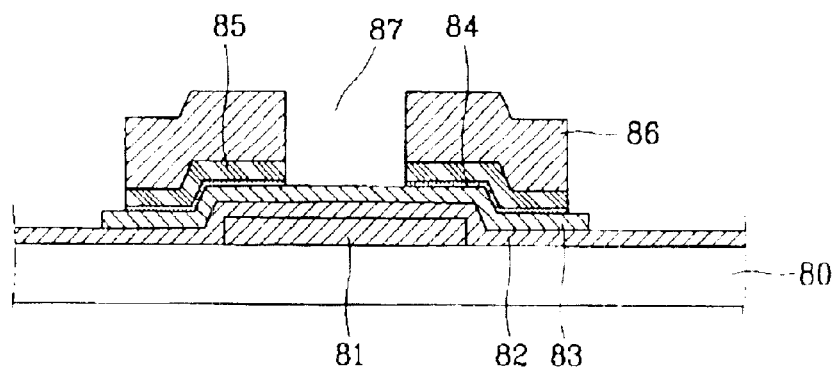

After the channel area is exposed, the semiconductor layer 83 corresponding to an active area is exposed by etching the extrinsic semiconductor layer 84 and the source/drain metal layer 85. The end surface of the resultant material is shown in FIG. 8D.

Figure 8E:
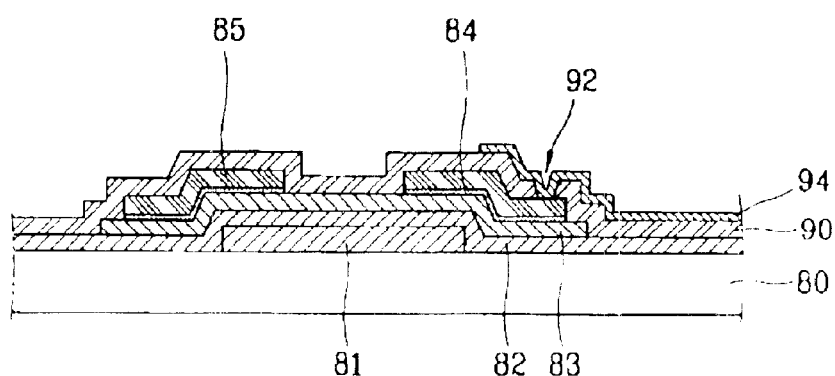

Thereafter, as shown in FIG. 8E, a protecting layer 90 is deposited over the front surface of the active panel 80. The protecting layer 90 over the drain electrode is patterned to form a contacting hole 92 using the third mask and a pixel electrode 94 is formed by patterning a conductive layer deposited over the front surface of the active panel using the forth mask. Through this contacting hole 92, the drain electrode and the pixel electrode 94 are inter-connected.

Through the above process, the TFT manufacturing process is completed using four masks. Here, the formation of the TFT in the active panel of the LCD is described, but the gray tone mask and the manufacturing method using it is applicable to the manufacturing process of semiconductor devices and another types of electronic elements, thus enabling the four-mask manufacturing process to be applicable to other core technology.

Particularly, as the shape of the TFT which is applied to the LCD panel varies from L-type to U-type, patterning becomes more difficult. Since the gray tone mask in accordance with the present invention enables accurate patterning, the quantity of light of the upper, lower, right and left of the mask to the scanning direction of the exposing apparatus can be made uniform thus enabling a reliable manufacturing process.

In accordance with the present invention, in the case of forming a gray tone with an exposing apparatus and a scanning method using a mask having different pattern gaps in the vertical and horizontal directions, since the influence of light transmitted to the photosensitive material through the mask in the vertical and horizontal directions is the same, the height of the gray tone formed is uniform. Therefore, the forming of fine patterns is possible and the manufacturing process which conventionally required many steps can be simplified. Particularly, the problem that an additional process step is needed since the thickness of the gray tone formed on the photosensitive material is different according to the scanning direction, can be solved. Accordingly, the manufacturing process is simplified and the gray tone photosensitive material with a certain height can be formed in just one process. Therefore, the TFT array of the LCD can be manufactured with just four sheets of masks thus reducing the manufacturing cost and increasing productivity.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A method of forming a pattern in a display device, comprising the steps of:
    providing a thin film;
    depositing a photo-sensitive layer on the thin film;
    exposing the photo-sensitive layer with light using a mask having a transparent portion and a partial transparent portion to pattern the photo-sensitive layer, the partial transparent portion including at least two portions having the different transparent ratios for introducing light in different quantities to the photo-sensitive layer in accordance with the irradiating direction of the light; and
    etching the thin film using the patterned photo-sensitive layer.

2. The method of claim 1, wherein the irradiating direction of the light is the scanning direction to the photo-sensitive layer.

3. The method of claim 1, wherein the partial transparent portion of the mask includes a plurality of slits separated from each other at predetermined gaps.

4. The method of claim 2, wherein the slits in the partial transparent portion have different widths.

5. The method claim 2, wherein the gap between the slits depends on the irradiating direction of the light.

6. The method of claim 1, wherein the photo-sensitive layer includes a positive photo-sensitive layer.

7. The method of claim 6, wherein the transparent ratio in a direction perpendicular to the direction of the light is higher than that in a direction parallel to the direction of the light.

8. The method of claim 7, wherein the width of the slits in the direction perpendicular to the irradiating direction of the light is narrower than that in the direction parallel to the irradiating direction of the light.

9. The method of claim 7, wherein the gap between the slits in the direction perpendicular to the irradiating direction of the light is larger than that in the direction parallel to the irradiating direction of the light.

10. The method of claim 1, wherein the photo-sensitive layer includes a negative photo-sensitive layer.

11. The method of claim 10, wherein the transparent ratio in a direction parallel to the direction of the light is higher than that in a direction perpendicular to the direction of the light.

12. The method of claim 11, wherein the width of the slits in the direction parallel to the irradiating direction of the light is narrower than that in the direction perpendicular to the irradiating direction of the light.

13. The method of claim 11, wherein the gap between the slit in the direction parallel to the irradiating direction of the light is larger than that in the direction perpendicular to the irradiating direction of the light.

14. A method of manufacturing a liquid crystal display panel, comprising the steps of:
    forming a gate electrode on a substrate using a first mask;
    forming an insulating layer, at least one semiconductor layer, and a metal layer over the substrate;
    depositing a photosensitive layer on the metal layer;
    exposing the photosensitive layer with light using a second mask including a partial transparent portion and a transparent portion to form a gray toned exposed area in a channel region and etch shielding areas over the source/drain electrode-forming region and a data line forming region of the metal layer, the partial transparent portion for diffracted-exposure including a plurality of slits having different gaps in the vertical and horizontal exposing directions;
    removing the metal layer and the semiconductor layer except for the gray toned exposed area and the etch shielding area;
    removing the photosensitive layer in the gray toned exposed area;
    forming source/drain electrodes by etching the semiconductor layer and the metal layer in the channel region;
    depositing a protecting layer over the surface of the substrate, the protecting layer having a contact hole on the drain electrode created by patterning the protecting layer using a third mask;
    forming a conductive layer over the surface of the substrate, the conductive layer being connected to the drain electrode through the contacting hole; and
    patterning the conductive layer using a fourth mask to form a pixel electrode.

15. The method of claim 14, wherein the second mask includes a gray tone mask.

16. The method of claim 14, wherein the semiconductor layer includes an intrinsic semiconductor layer and an extrinsic semiconductor layer.

17. The method of claim 16, wherein the extrinsic semiconductor layer and the metal layer at the channel region are removed simultaneously.

18. The method of claim 16, wherein the extrinsic semiconductor layer and the metal layer at the channel region are removed.

19. The method of claim 14, wherein the exposing direction of the photosensitive layer is the scanning direction of the light into the photosensitive layer.

20. A gray tone mask which is patterned and used in a photolithographic manufacturing process, said mask having a transparent portion and a partial transparent portion for patterning a photo-sensitive layer, the partial transparent portion including at least two portions having different transparent ratios for introducing light in different quantities to the photo-sensitive layer in accordance with the irradiating direction of the light.

21. The gray tone mask of claim 20, wherein, the irradiating direction of the light is the scanning direction to the photo-sensitive layer.

22. The gray tone mask of claim 20, wherein the partial transparent portion of the mask includes a plurality of slits separated from each other at predetermined gaps.

23. The gray tone mask of claim 20, wherein the slits in the partial transparent portion have different widths.

24. The gray tone mask of claim 20, wherein the slits in the partial transparent portion have different dimensions.

25. The gray tone mask of claim 20, wherein the gap between the slits depends on the irradiating direction of the light.

26. The gray tone mask of claim 20, wherein the photo-sensitive layer includes a positive photo-sensitive layer.

27. The gray tone mask of claim 26, wherein the transparent ratio in a direction perpendicular to the direction of the light is higher than that in a direction parallel to the direction of the light.

28. The gray tone mask of claim 27, wherein the width of the slits in the direction perpendicular to the irradiating direction of the light is narrower than that in the direction parallel to the irradiating direction of the light.

29. The gray tone mask of claim 27, wherein the gap between the slits in the direction perpendicular to the irradiating direction of the light is larger than that in the direction parallel to the irradiating direction of the light.

30. The gray tone mask of claim 20, wherein the photo-sensitive layer includes a negative photo-sensitive layer.

31. The gray tone mask of claim 30, wherein the transparent ratio in a direction parallel to the direction of the light is higher than that in a direction perpendicular to the direction of the light.

32. The gray tone mask of claim 31, wherein the width of the slits in the direction parallel to the irradiating direction of the light is narrower than that in the direction perpendicular to the irradiating direction of the light.

33. The gray tone mask of claim 31, wherein the gap between the slit in the direction parallel to the irradiating direction of the light is larger than that in the direction perpendicular to the irradiating direction of the light.

* * * * *